United States Patent

Katz

[11] 4,106,025
[45] Aug. 8, 1978

[54] COUPLING CONVERTER FOR VEHICLE ANTENNAS

[76] Inventor: Sidney Katz, 2113 Fort Worth Ave., Alexandria, Va. 22304

[21] Appl. No.: 735,039

[22] Filed: Oct. 22, 1976

[51] Int. Cl.² .......................... H01Q 1/32; H01Q 3/00
[52] U.S. Cl. .................................... 343/715; 343/858; 343/749; 325/21
[58] Field of Search ............... 343/715, 858, 749, 876, 343/901; 325/21, 18, 22, 23, 117

[56] References Cited

U.S. PATENT DOCUMENTS

| 3,359,559 | 12/1967 | Guinn | 343/901 |
| 3,665,310 | 5/1972 | Tweed, Jr. | 325/117 |
| 3,725,942 | 4/1973 | Ukmar | 343/715 |

*Primary Examiner*—Alfred E. Smith
*Assistant Examiner*—David K. Moore
*Attorney, Agent, or Firm*—Sherman & Shalloway

[57] ABSTRACT

A coupling converter for use of a broadcast-receiving antenna both with its broadcast receiver and with a citizens band transceiver, including impedance matching means and a priority switch to protect the transceiver from overload by transmission without sufficient antenna loading.

10 Claims, 3 Drawing Figures

COUPLING CONVERTER FOR VEHICLE ANTENNAS

BACKGROUND OF THE INVENTION

The present invention relates to antennas for transmitting and receiving radio signals and is concerned, more particularly, with the conversion of mobile broadcast-reception antennas for use with citizens band transceivers without requiring exterior, visible evidence of the transceiver installation.

BRIEF DISCUSSION OF THE PRIOR ART

The dramatic increase in the popularity and utilization of citizens band transceivers not only has provided great convenience and a new scope of safety and emergency communication for mobile units, such as boats and most forms of wheeled vehicles, but also has provoked an extreme rate of theft of such transceivers.

Reportedly, the average retention period of such transceivers by their original owners is as little as six to eight weeks in the worst theft areas. With such transceivers averaging well over $100.00 and often costing in the neighborhood of $300.00, insurance companies are either refusing to cover such installations or are requiring extra premiums for appropriate riders attached to a basic policy.

The most effective manner of avoiding theft has employed a so-called "slipmount" which permits quick removal of the transceiver, with or without a quick-mounting antenna such as a gutter-mount or magnetic-mount unit. However, these mounts make it easier to steal a transceiver, sometimes wth the antenna, if it is forgotten in the car or a deliberate chance is taken while the vehicle is to be unattended for only a few minutes.

Many people are deterred by this likelihood of theft amd consequent costs or aggravation of removing and transporting the units every time the vehicle is to be left unattended. Those who can use citizens-band as a tool, such as truckers, or other who frequently drive long distances, can justify the costs and aggravations, as can hobbyists. However, many people forego the safety and security of having a transceiver available — and are unable to so assist others in emergencies — since their actual or anticipated need for transmitting capability is either negligible or infrequent in relation to these problems.

The greatest problem in hiding or obscuring citizens-band installation is that of obscuring or disguising the antenna. A normal, quarter-wave antenna for citizens-band frequencies is a whip of about 102 inches, which is an absolute giveaway of the presence of the installation.

Shorter antennas are available but exhibit recognizable evidence of their nature by the presence of loading coils at their base or top or at a midpoint.

With normal transceiver antennas being so easily distinguishable from the familiar AM or FM broadcast-receiving antennas, prime theft targets are easily identified in a parking lot or other location at which the vehicle may be left unattended. Therefore, even if the interior structure of a vehicle permits installation of a transceiver where it is not easily identified through a window of the vehicle, the presence of a high-efficiency citizens-band antenna invites and attempted theft. If the transceiver is present, it can be lost. If it has been removed for safe keeping, the vehicle still is subject to damage by the theft attempt.

Accordingly, recent attempts have been made to obscure these installations by rather sophisticated, complex and appropriately expensive means.

These have included units which modify the AM or FM broadcast receiver to change its frequency range and to incorporate a transmitting capability. Such units may be appropriate as originally-installed equipment on new cars but are not susceptible to standardization for the conversion of the millions of existing vehicles.

More appropriate to such conversions are the more recent, power-operated antennas which are retracted within a portion of the vehicle body. However, the presence of a second antenna fixture, which necessarily is sufficiently broad to receive a loading coil, is sufficient to alert a skilled thief.

More recently, conversion units have been proposed in which both a broadcast receiver and a citizens-band transceiver are coupled to a conventional receiving antenna via selective filters which permit alternate use of the same antenna. This approach is an improvement, in terms of exterior appearance of the installation, but its complexity detracts from the sensitivity and output of the transceiver with the short antenna, which is already a compromise with efficiency. This latter system is disclosed in U.S. Pat. No. 3,725,942 to Milosh L. Ukmar, issued Apr. 3, 1973.

None of the prior expedients have been found to be entirely satisfactory.

SUMMARY OF THE INVENTION

In general, the preferred form of the present invention comprises a coupling converter having a switch for selectively connecting and isolating a broadcast receiver and a citizensband transceiver, in alternation, with regard to a broadcast-reception antenna, and impedance matching means for connection between the switch and the transceiver. Preferably, the switch means is responsive to a flow of current to the transceiver to give the transceiver priority with regard to connection with the antenna.

OBJECTS TO THE INVENTION

It is an object of the present invention to provide for the conversion of broadcast-receiving antennas for use with transceivers.

It is another object of the present invention to provide a coupling converter for utilization of mobile broadcast-reception antennas with transceivers without external change in the appearance of the installation.

It is a further object of the present invention to provide a converter for mobile broadcast-receiving installations for accommodation of a transceiver by the receiving antenna.

It is another object of the present invention to provide a converter for mobile broadcast-receiving installations which is compact and capable of concealment.

It is another object of the present invention to provide a converter for insertion between a broadcast-receiving antenna and a broadcast receiver and providing safe utilization of the antenna by a transceiver normally requiring an antenna of greater length.

It is yet another object of the present invention to provide a coupling converter for use of an existing broadcast receiving antenna by both the broadcast receiver and a transceiver with antenna-priority being accorded to the transceiver.

It is a particular object of the present invention to provide a coupling converter for insertion between a broadcast-receiving antenna and a receiver in a position in which it is hidden beneath the dash of a vehicle and without alteration of the external appearance of the vehicle.

It is another particular object of the present invention to provide a coupling converter for utilizing a transceiver with an inadequate-length antenna and a conventional broadcast receiver while preventing damage to the transmitting portion of the transceiver.

A further particular object of the present invention is the provision of a compact and economical converter for transceivers and broadcast receivers using the same antenna with impedance matching means and a priority switch for connecting the transceiver with the antenna when a current is supplied through the transceiver.

BRIEF DESCRIPTION OF THE DRAWINGS

These and other objects of the invention, as well as a better understanding thereof, may be derived from the following description and the accompanying drawings, in which.

DETAILED DESCRIPTION OF THE PREFERRED EMBODIMENTS

Figure 1:
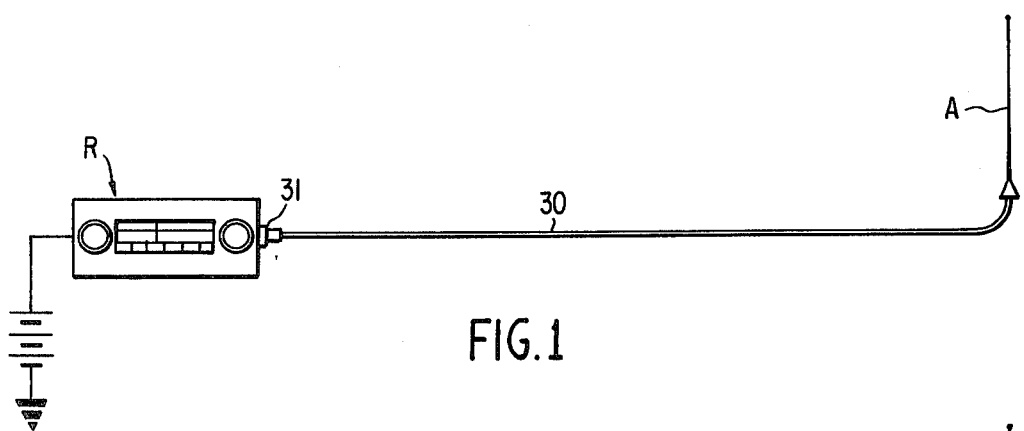
FIG. 1 is a schematic view of a broadcast-receiving installation for a vehicle.
Figure 2:
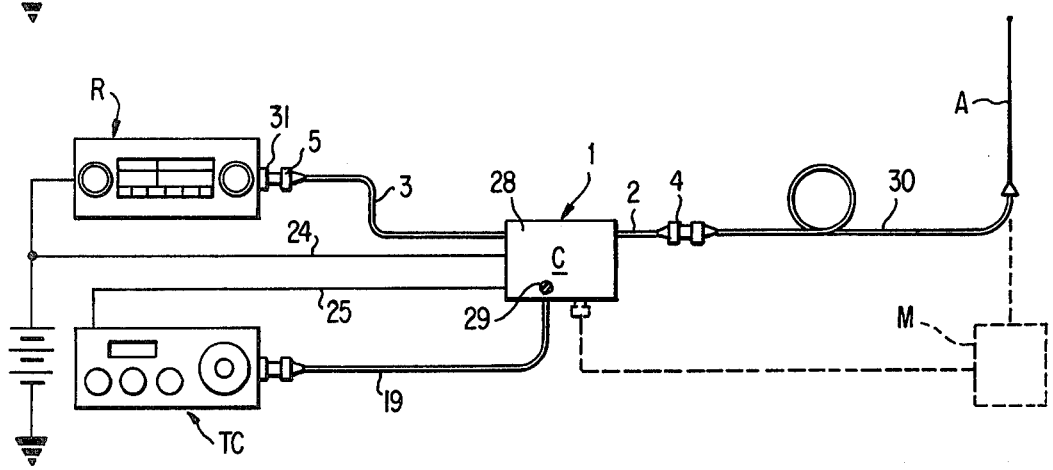
FIG. 2 is a view similar to FIG. 1 and showing the preferred form of coupling converter installed within the broadcast-receiving system.

As shown in the drawings, the preferred form of coupling converter C of the present invention is inserted between a convential antenna A and broadcast receiver R.

The coupling converter C includes a base 1 mounting an intermediate antenna lead 2 and an intermediate receiver lead 3 of conventional coaxial cable. The antenna lead 2 terminates in a connector 4 for receiving the connector of the antenna cable, while the receiver lead 3 carries a connector 5 for engagement with the receiver R in place of the antenna cable.

Figure 3:
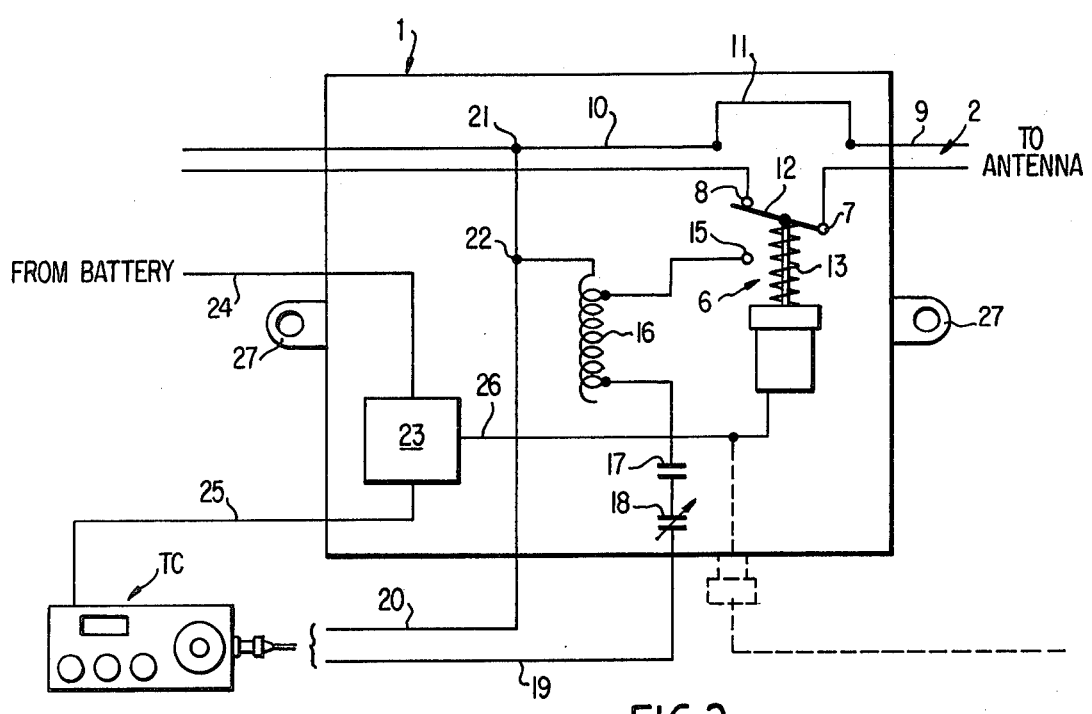
FIG. 3 is a schematic view of the components of the preferred converter on an enlarged scale.

As best shown in FIG. 3, the coupling converter includes a switch 6 having a contact 7 connected to the center conductor of the antenna lead 2 and a contact 8 connects to the center conductor of the receiver lead 3. The shield or braids 9 and 10 of the antenna and receiver leads 2 and 3 are directly connected to each other such as by a shunt portion 11.

The switch 6 includes an arm 12 biased by a spring 13 to close between the contacts 7 and 8 and moveable by a solenoid 14 to close the antenna contact 7 with an auxiliary lead contact 15. The lead contact 15 connects via a series connection of an impedance coil 16, a fixed capacitor 17 and a variable capacitor or trimmer 18, with the center conductor of an auxiliary lead 19. The shield or braid 20 of the auxiliary lead 19 is connected at 21 to the shield 10 of the receiver lead 3, or another convenient point such as the shunt portion 11, and at 22 to the tail of the coil 16.

The base 1 also carries a conventional current-responsive switch or relay 23 having a connection or line 24 for receiving a supply of current from the vehicle battery and a load connection or line 25 for supplying current to a citizens-band transceiver TC. The relay 23 is connected with the solenoid 14 via a connection or wire 26 to energize the solenoid when current is delivered to the transceiver. Where the broadcast receiving antenna is of the power-extended type, the relay 23 advantageously may be connected to the antenna motor M, as shown in dotted lines, to ensure extension of the antenna whenever the transceiver is turned on.

The base 1 has been shown schematically but is to include any suitable means for securement thereof, at a convenient location beneath the dash or at a similar, hidden location of the vehicle, such as the apertured flanges 27.

The assembly on base 1 preferably is protected by a cover 28 which may be removable or fixed, as desired. If the cover is to be fixed, access to the trimmer 18 is provided such as by an aperture 29 or other suitable means. In the case of a fixed cover, an external connector is preferable to provide for ready connection of the relay line 26 with the antenna motor M.

INSTALLATION OF THE PREFERRED COUPLING CONVERTER

For installation of the coupling converter, with a transceiver, in the broadcast-receiving installation of FIG. 1, the only necessary disturbance of the original system is that of removing the antenna cable 31 from the receiver at the connector 31. The antenna cable is then coupled to the intermediate antenna lead 2 via connector 4 and the intermediate receiver lead 3 is coupled to the receiver via the remaining portion of connector 31 and the connector 5.

After positioning and securement of the transceiver and coupling converter, the line 25 is connected to the power input of the transceiver and the auxiliary lead 19 is coupled to the antenna connection thereof. The power line 24, or an extension thereof, may then be connected to the vehicle battery source at an appropriate point, with conventional protective fuses being incorporated in the power circuit. If appropriate, a connection of the relay line 26 with the antenna motor M may then be made via the external connector.

OPERATION OF THE PREFERRED COUPLING CONVERTER

In use, the coupling converter normally maintains the arm 12 in contact between the antenna contact 7 and the receiver contact 8, as shown in solid lines in FIG. 3, under the bias of the spring 13. If the transceiver is turned on, however, the current-responsive relay 23 immediately energizes the solenoid 14 to draw the free end of the switch arm 12 into contact with the auxiliary lead contact 15, thereby according priority of antenna connection to the transceiver and precluding operation of the transmitter without sufficient load, which would be damaging to many forms of citizens-band transceivers. If an antenna motor is present, the antenna is similarly triggered to extend itself to its full height.

Initially, an SWR meter is coupled between the transceiver and the auxiliary lead 19 and the antenna system comprising the antenna A, cable 30, intermediate lead 9, switch 6, coil 16, capacitors 17 and 18 and auxiliary lead 19 is tuned by means of the trimmer 18, to the optimum transmitting performance.

Upon removal of the SWR meter and reconnection of the the auxiliary lead 19 with the transceiver, the broadcast receiver and the transceiver may be used interchangeably, as desired. With protective antenna priority for the transceiver enforced by the relay 23, however, the broadcast receiver will not receive a signal from the antenna while the transceiver is turned on.

I have found that a handmade prototype, coupling converter employing an impedance coil formed in five one-half inch windings of central-conductor wire, separated about one-half inch, a fixed capacitor of 531 picofarads and a trimmer having a range of 0 to 50 picofarads, provides sufficient range for effective impedance matching of a variety of vertical antenna lengths and locations on automobiles.

Surprisingly, a similar prototype, coupling converter according to the present invention is effective in transmitting and receiving acceptable citizens-band communication via the essentially horizontal, windshield antenna of a General Motors car, even though the sensitivity and transmitting range are less than would be achievable with a conspicuous, 102 inch whip. Depending upon atmospheric conditions, the Audiovox Model 500 CB transceiver thus coupled with the converted windshield antenna is capable of transmission over distances in excess of 5 miles and reception from greater distances.

Therefore, it is evident that the coupling converter of the present invention provides a particularly advantageous solution to the problem of the conspicuous gear normally associated with citizens-band installations.

Furthermore, the present invention is especially advantageous in the hidden accommodation of transceivers in the millions of vehicles already on the road with broadcast-receiving antennas.

In view of the simplicity and consequent minimization of cost achieved in the coupling converter of the present invention, it is expected that such units, in production configuration, will compare favorably with the cost of the less conspicuous of the citizens-band antennas currently available.

For a production configuration, it is anticipated that certain variations in the specifics of the disclosed coupling converter may be preferred. For example, the antenna lead 2 may be replaced with other lead means such as an antenna-connection socket. Also, a trimmer of greater range than that of the prototype or a single trimmer may be desired in preference to the fixed capacitor and trimmer in series.

Therefore, it is to be understood that various changes may be made in the details of the invention as it has been disclosed without sacrificing the advantages thereof or departing from the scope of the appended claims.

What is claimed is:

1. A coupling conversion unit for connecting a citizens band transceiver in a broadcast-receiving installation having a broadcast receiver, a broadcast antenna and shielded cable between the antenna and the receiver, said coupling conversion unit comprising:
   (a) a base member having
   (b) intermediate lead means for connection between said shielded cable and said receiver, said intermediate lead means including
   (c) a shielded antenna lead member for connection with said shielded cable and
   (d) a shielded receiver lead member for connection with said broadcast receiver,
   (e) auxiliary lead means for connection with said citizens band transceiver, said auxiliary lead means including,
   (f) impedance matching means and,
   (g) a shielded auxiliary lead member;
   (h) the shielding conductors of said auxiliary lead member and said antenna and receiver lead members being connected in common,
   (i) priority switch means, relay means and overload preventing means responsive to a flow of current to the transceiver to give the transceiver priority over the receiver by immediately electrically connecting exclusively said antenna lead member to the transceiver via said auxiliary lead means whenever the transceiver is activated, said priority switch means including
   (j) connecting means for selectively connecting and disconnecting the center conductors of said antenna lead member and said receiver lead member,
   (k) positioning means connected to said connecting means for controlling the position of said connecting means whereby the center conductor of said antenna lead member is connected with the center conductor of said auxiliary lead member when the center conductor of said antenna lead member and said receiver lead member are disconnected so that said receiver lead member is electrically isolated from said auxiliary lead member and said antenna lead member whenever the transceiver is activated.

2. The coupling conversion unit of claim 1 including electrical operating means for said priority means for effecting connection of the center conductor of said antenna lead member with the center conductor member of said auxiliary lead member.

3. The coupling conversion unit of claim 2 including biasing means opposing said electrically actuated means of said priority means.

4. The coupling conversion unit of claim 2 including a conductor for supplying current to said transceiver and current relay means responsive to a current through said conductor for actuating said electrical operating means of said switch means.

5. The coupling conversion unit of claim 4 in which the installation includes an extensible antenna and a motor for extending said antenna, and means for connecting said current relay means to actuate said antenna motor with said electric operating means of said switch.

6. The coupling conversion unit of claim 4 in which said impedance matching means includes an inductance coil and variable capacitor means in series with each other and with the center conductor of said auxiliary lead means.

7. The coupling conversion unit of claim 1 wherein said relay means is current responsive.

8. The coupling conversion unit of claim 7 wherein said connecting means further comprises means for mechanically connecting and disconnecting the center conductors of said antenna lead member to said auxiliary lead member and said receiver lead member.

9. The coupling conversion unit of claim 8 wherein said positioning means is a solenoid having a coil connected to said current responsive relay and a core connected to said connecting means.

10. The coupling conversion unit of claim 9 wherein said connecting means is a conducting arm.

* * * * *